(12) United States Patent
Huang et al.

(10) Patent No.: US 8,569,141 B2
(45) Date of Patent: Oct. 29, 2013

(54) POLYSILICON RESISTOR FORMATION IN A GATE-LAST PROCESS

(75) Inventors: Chun-Hung Huang, Zhubei (TW); Jyh-Huei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 236 days.

(21) Appl. No.: 13/222,181

(22) Filed: Aug. 31, 2011

(65) Prior Publication Data

US 2013/0052789 A1 Feb. 28, 2013

(51) Int. Cl.
 *H01L 21/20* (2006.01)
(52) U.S. Cl.
 USPC ..................... 438/382; 257/E21.09
(58) Field of Classification Search
 USPC ....................... 438/382; 257/E21.09
 See application file for complete search history.

(56) References Cited

U.S. PATENT DOCUMENTS

| | | | | |
|---|---|---|---|---|
| 6,627,971 | B1 * | 9/2003 | Shen et al. | 257/538 |
| 8,058,125 | B1 | 11/2011 | Lin et al. | |
| 2007/0218661 | A1 * | 9/2007 | Shroff et al. | 438/510 |
| 2011/0266637 | A1 * | 11/2011 | Lee et al. | 257/410 |
| 2013/0049168 | A1 * | 2/2013 | Yang et al. | 257/538 |

* cited by examiner

*Primary Examiner* — Alexander Ghyka
*Assistant Examiner* — Stanetta Isaac
(74) *Attorney, Agent, or Firm* — Slater & Matsil, L.L.P.

(57) ABSTRACT

A method includes forming a polysilicon layer over a substrate, forming a hard mask over the polysilicon layer, and doping a first portion of the hard mask with a dopant to form a doped hard mask region, wherein a second portion of the hard mask is not doped with the dopant. An etching step is performed to etch the first and the second portions of the hard mask, wherein the second portion of the hard mask is removed, and wherein at least a bottom portion of the doped hard mask region is not removed. After the etching step, the bottom portion of the doped hard mask region is removed. Electrical connections are formed to connect to a portion of the polysilicon layer in order to form a resistor.

20 Claims, 16 Drawing Sheets

POLYSILICON RESISTOR FORMATION IN A GATE-LAST PROCESS

BACKGROUND

With the advancement of the integrated circuits, more methods for manufacturing integrated circuit devices were explored. For example, in the formation of transistors, gate-first and gate-last methods were developed. In the gate-first methods, the gates of transistors are formed before the formation of source and drain regions. In the gate-last methods, dummy gates of transistors are formed, followed by the formation of source and drain regions. The dummy gates of the transistors are then removed and replaced with new gates, which may be metal gates.

Besides the formation of transistors, there are other devices such as transistors, capacitors, inductors, and the like, that may also be formed in the same chip as the transistors. The manufacturing processes of these devices need to be integrated with the manufacturing of transistors to develop a low-cost and a reliable manufacturing process.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of forming a polysilicon resistor is provided in accordance with various embodiments. The intermediate stages of forming the polysilicon resistor and replacement gates of transistors are illustrated. The variations of the embodiments are discussed. Throughout the various views and illustrative embodiments, like reference numbers are used to designate like elements.

Figure 1:
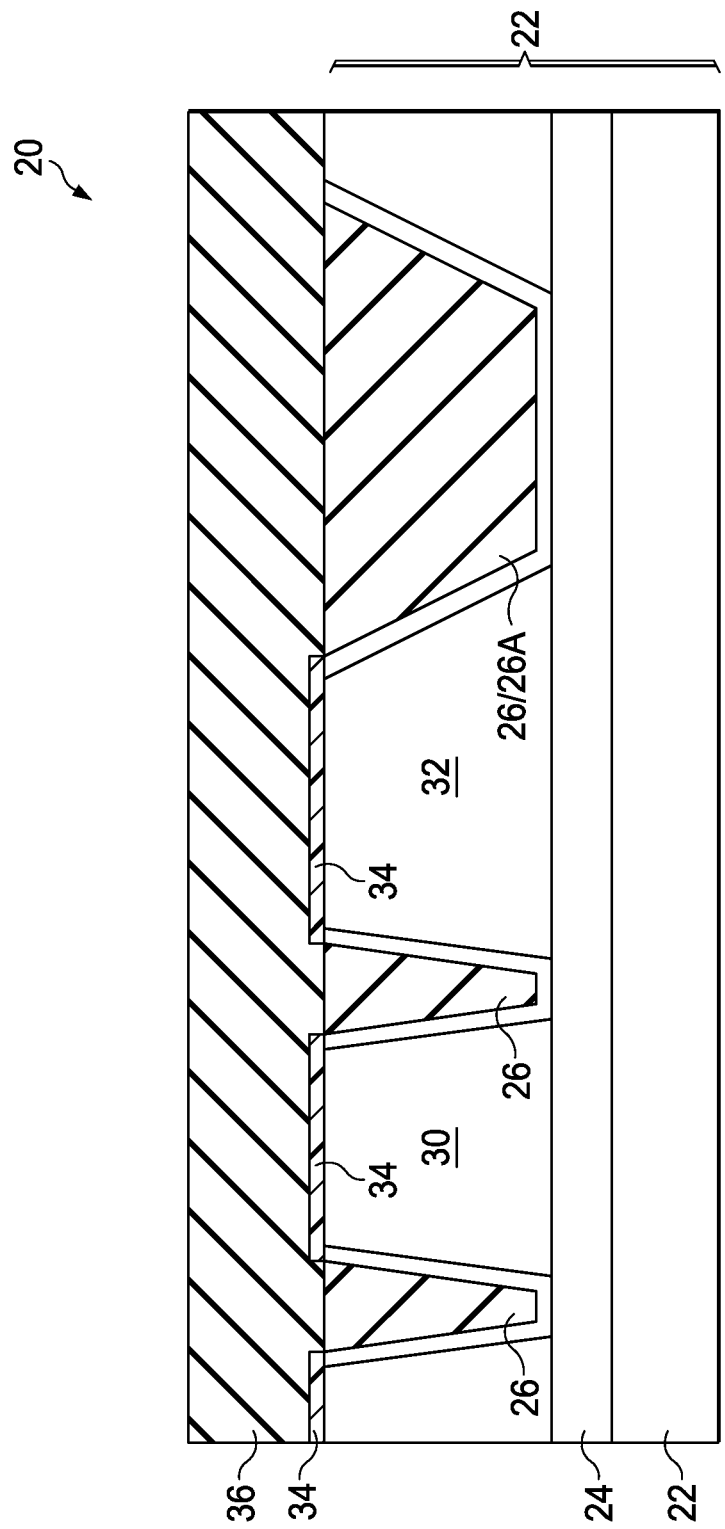
FIGS. 1 through 11 are cross-sectional views of intermediate stages in the manufacturing of a polysilicon resistor in accordance with embodiments.

Referring to FIG. 1, wafer 20 is provided. Wafer 20 includes semiconductor substrate 22. In an embodiment, semiconductor substrate 22 is a silicon substrate. In alternative embodiments, semiconductor substrate 22 comprises other semiconductor materials such as silicon germanium, silicon carbon, III-V compound semiconductor materials, or the like. Deep n-well region 24 may be formed deep into semiconductor substrate 22. P-well region 30 and n-well region 32 are formed in semiconductor substrate 22. Shallow-trench isolation (STI) regions 26 may be formed in semiconductor substrate 22, and may separate p-well region 30 and n-well region 32 from each other. STI regions 26 includes STI region 26A for forming polysilicon resistor 37 (not shown in FIG. 1, please refer to FIG. 11) thereon. In an embodiment, deep n-well region 24, p-well region 30, and n-well region 32 are formed by implanting appropriate p-type or n-type impurities into semiconductor substrate 22. In alternative embodiments, the formation of deep n-well region 24, p-well region 30, and n-well region 32 may also involve epitaxial growth of a semiconductor layer and the in-situ doping of appropriate impurities during the epitaxial growth.

Mask layer 34 is formed over portions of semiconductor substrate 22, and covers the top surfaces of p-well region 30 and n-well region 32. Mask layer 34 may be formed of an oxide such as silicon oxide, and hence is referred to as oxide mask 34 hereinafter, although it may also be formed of other dielectric materials. Polysilicon layer 36 is deposited over oxide mask 34 and STI regions 26. In an embodiment, polysilicon layer 36 has a thickness between about 500 Å and about 800 Å, for example, although different thicknesses may be used.

Figure 2:
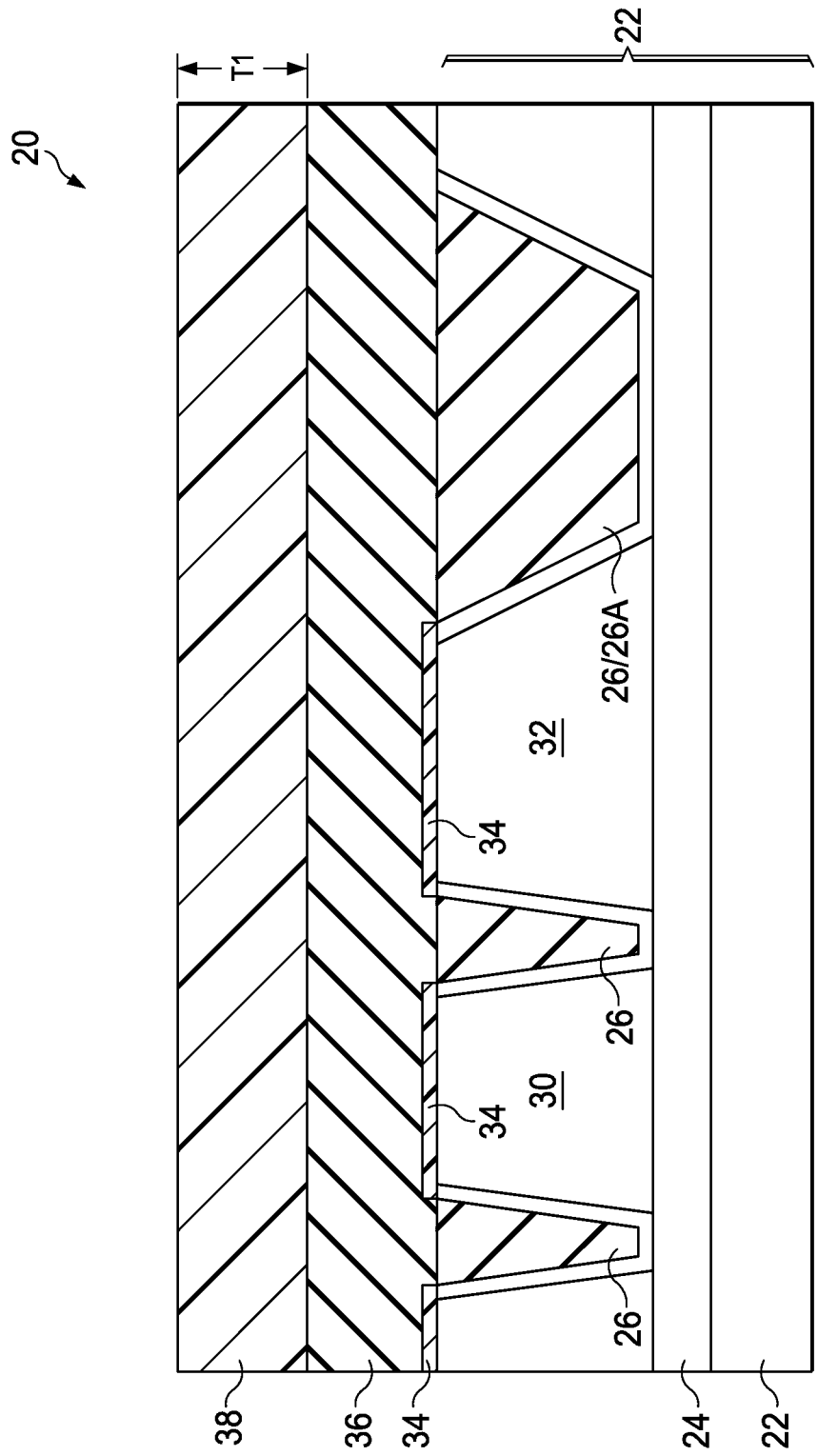

FIG. 2 illustrates the formation of hard mask layer 38, which may be formed of an oxide, such as silicon oxide, silicon oxynitride, silicon nitride, or the like. Thickness T1 of hard mask layer 38 may be between about 800 Å and about 1,200 Å, for example, although different thicknesses may be used.

Figure 3:
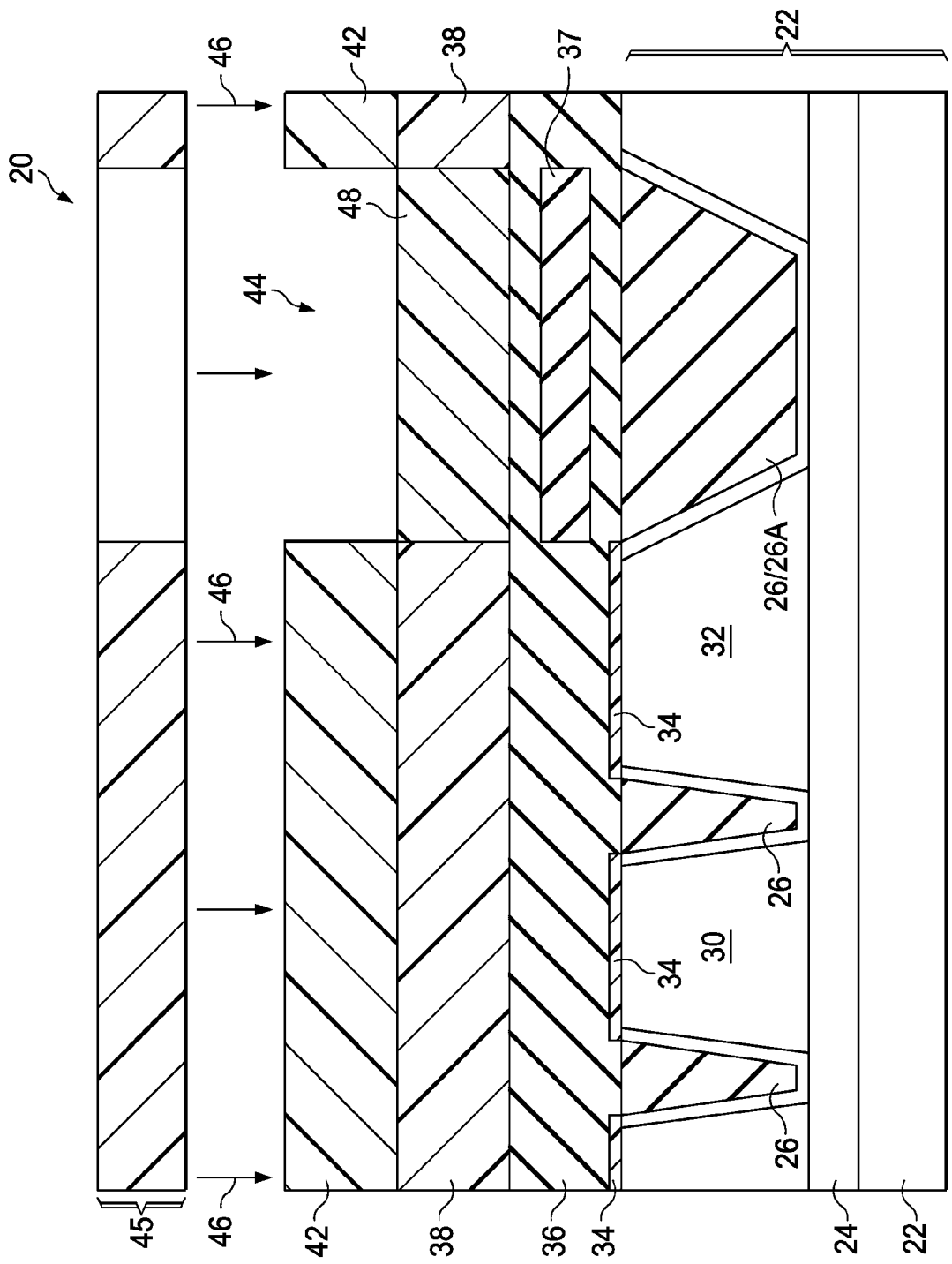

Referring to FIG. 3, photo resist 42 is formed and patterned, and a portion of hard mask layer 38 that is directly over STI region 26A is exposed through opening 44 in photo resist 42. The patterning of photo resist 42 may be performed using lithography mask 45, which comprises opaque portions for blocking the light for exposing photo resist 42, and transparent portions for allowing the light to pass. Next, lithography mask 45 is removed from over wafer 20, and an implantation (indicated by arrows 46) is performed to dope an n-type or a p-type impurity into polysilicon layer 36, forming doped polysilicon region 37. The implant energy is adjusted depending on the thicknesses of hard mask layer 38 and polysilicon layer 36, so that the implanted impurity is disposed into polysilicon layer 36. An exemplary implanted impurity includes boron. The appropriate dosage is partially determined by the desirable resistivity of the resulting doped polysilicon region 37, and the lower the resistivity is desired, the higher the dosage is used. In an exemplary embodiment, the dosage is between about $1.00E15/cm^2$ and about $5.00E15/cm^2$. Although FIG. 3 shows that doped polysilicon region 37 is concentrated in a middle layer of polysilicon layer 36, it may also extend to the top surface and/or the bottom surface of polysilicon layer 36.

Using the same photo resist 42 as the implantation mask, an additional dopant may also be implanted (also indicated by arrows 46) into hard mask layer 38. In the following discussed embodiments, carbon is used as an example of the additional dopant. In alternative embodiments, other dopants such as nitrogen, boron, and the like may also be used, providing that in the subsequent etching step shown in FIG. 5, these dopants may cause an adequate reduction in the etching rate of the doped portions of hard mask layer 38. The implant energy is adjusted depending on thickness T1 of hard mask layer 38 so that carbon is implanted into hard mask layer 38, and substantially no carbon is doped into polysilicon layer 36. In alternative embodiments, carbon may also be implanted into polysilicon layer 36. Throughout the description, the portion of hard mask layer 38 that is implanted with carbon is alternatively referred to as carbon-doped hard mask region 48.

Figure 4:
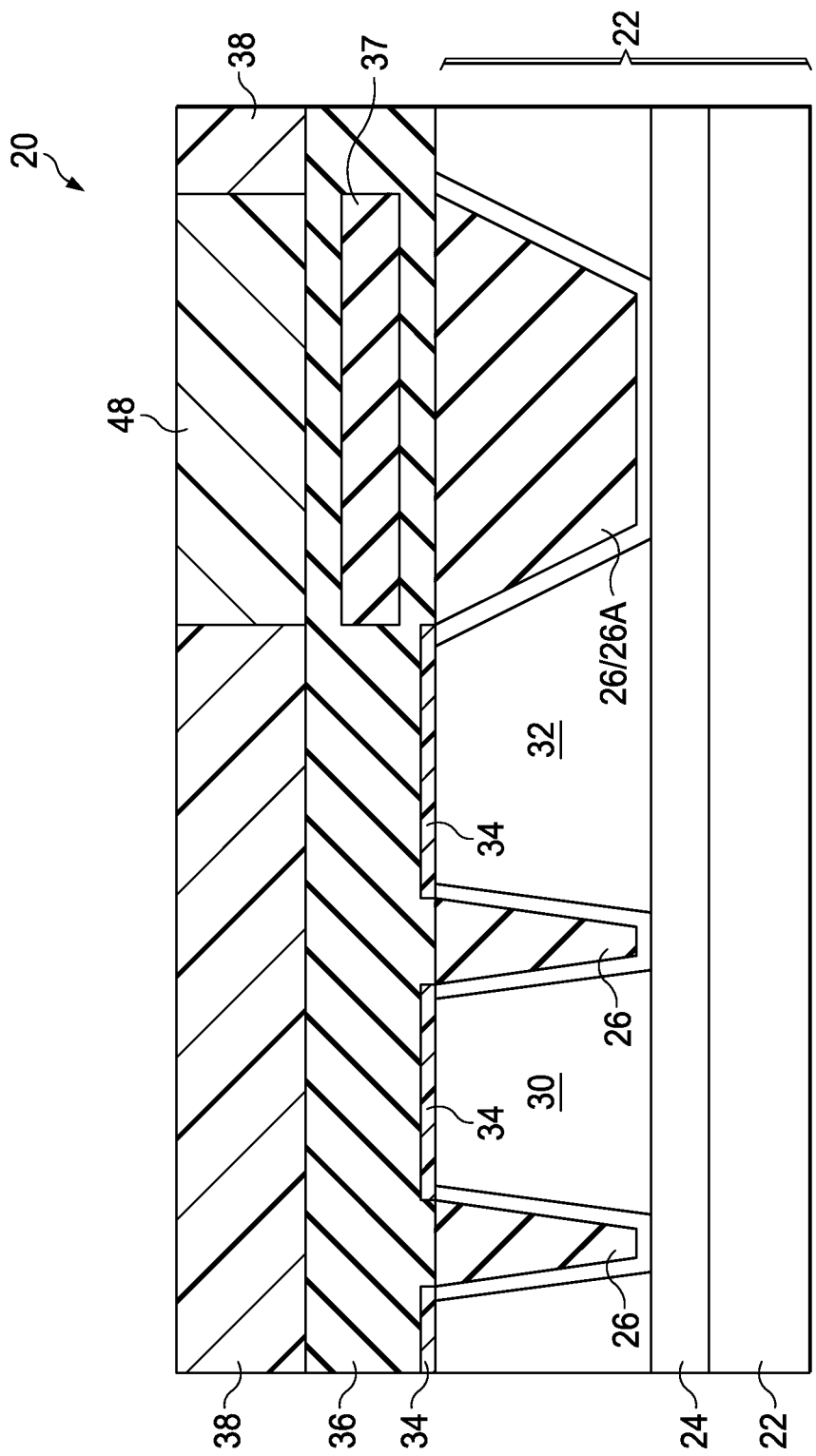
Figure 5:
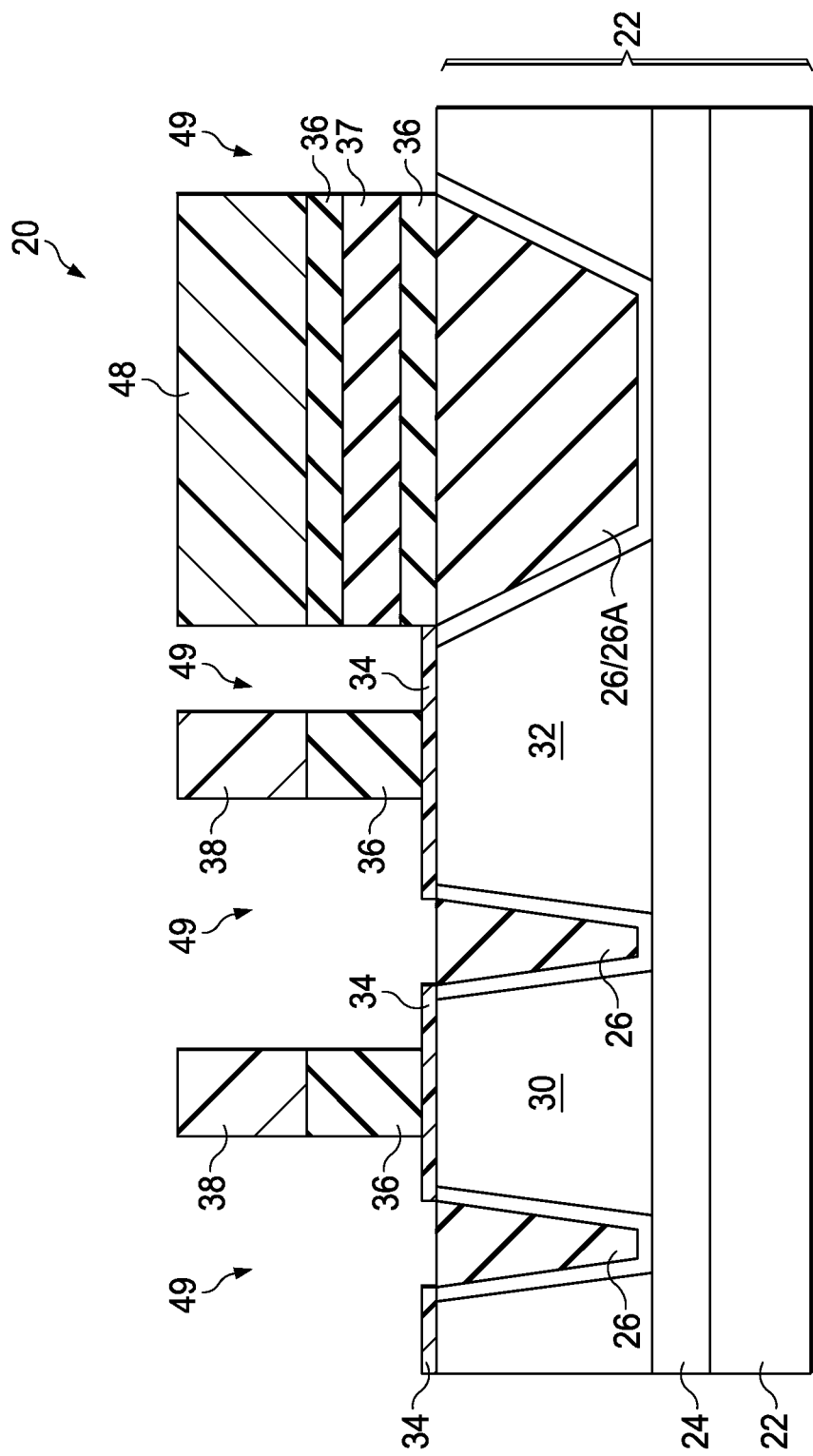

Referring to FIG. 4, photo resist 42 is removed. Portions of hard mask layer 38 and polysilicon layer 36 are then etched, and the resulting structure is shown in FIG. 5. Openings 49 are formed in polysilicon layer 36 as a result of the etching. The etching of polysilicon layer 36 may stop on oxide mask 34 and STI regions 26. The etching step shown in FIG. 5 may be performed using a photo resist (not shown) as an etching mask, and the photo resist is then removed after the etching of hard mask layer 38 and polysilicon layer 36.

Figure 6:
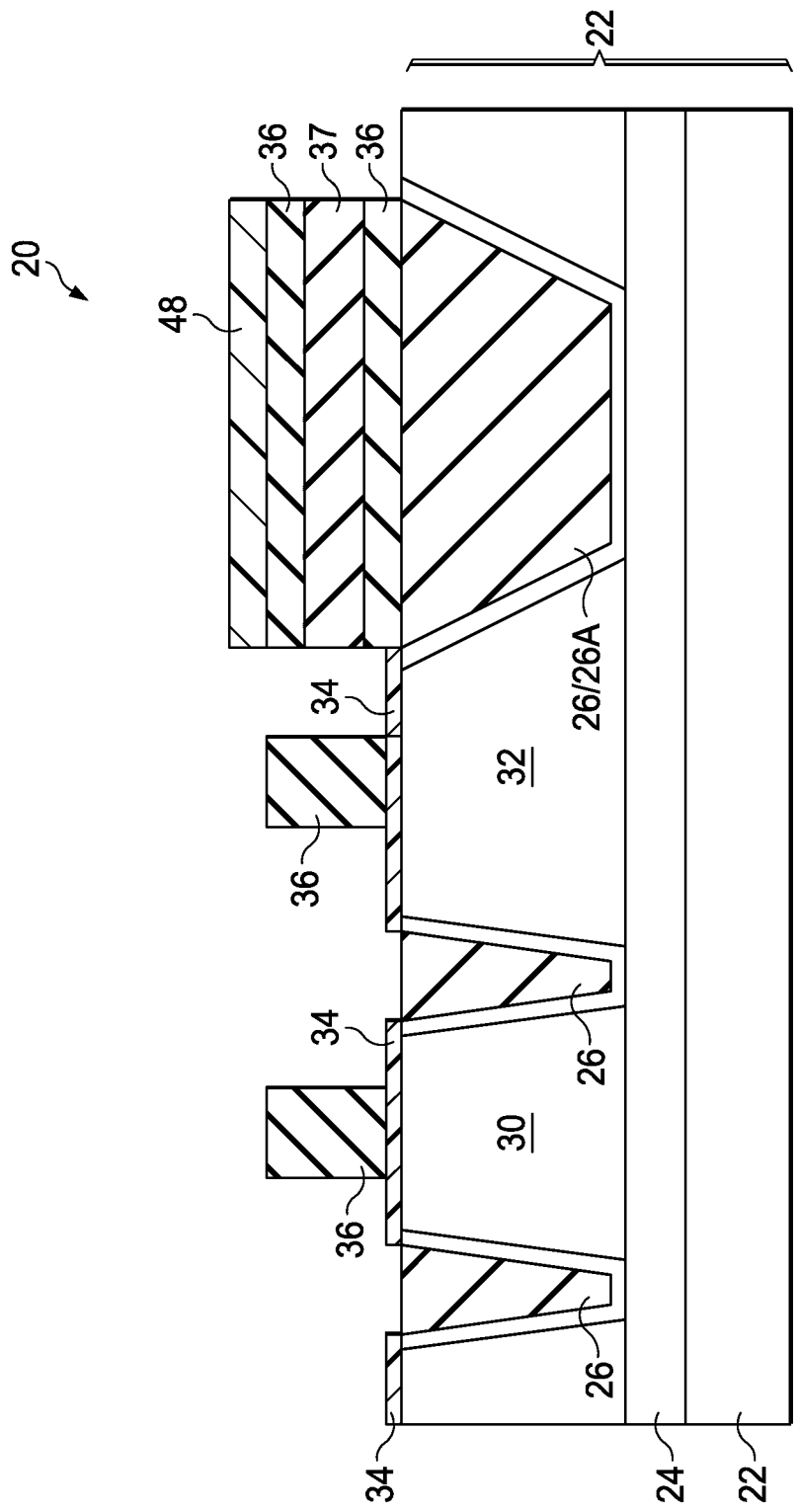

Next, as shown in FIG. 6, the exposed hard mask layer 38, including doped hard mask region 48 and undoped portions of hard mask layer 38, is etched. The etchant is selected so that the etching rate of carbon-doped hard mask region 48 is lower than the etching rate of the portions of hark mask layer 38 that are not doped with carbon. Accordingly, after the etching, at least a bottom layer of carbon-doped hard mask region 48 remains to cover a portion of polysilicon layer 36, while the portions of mark mask layer 38 that are not doped with carbon are fully removed.

Figure 7:
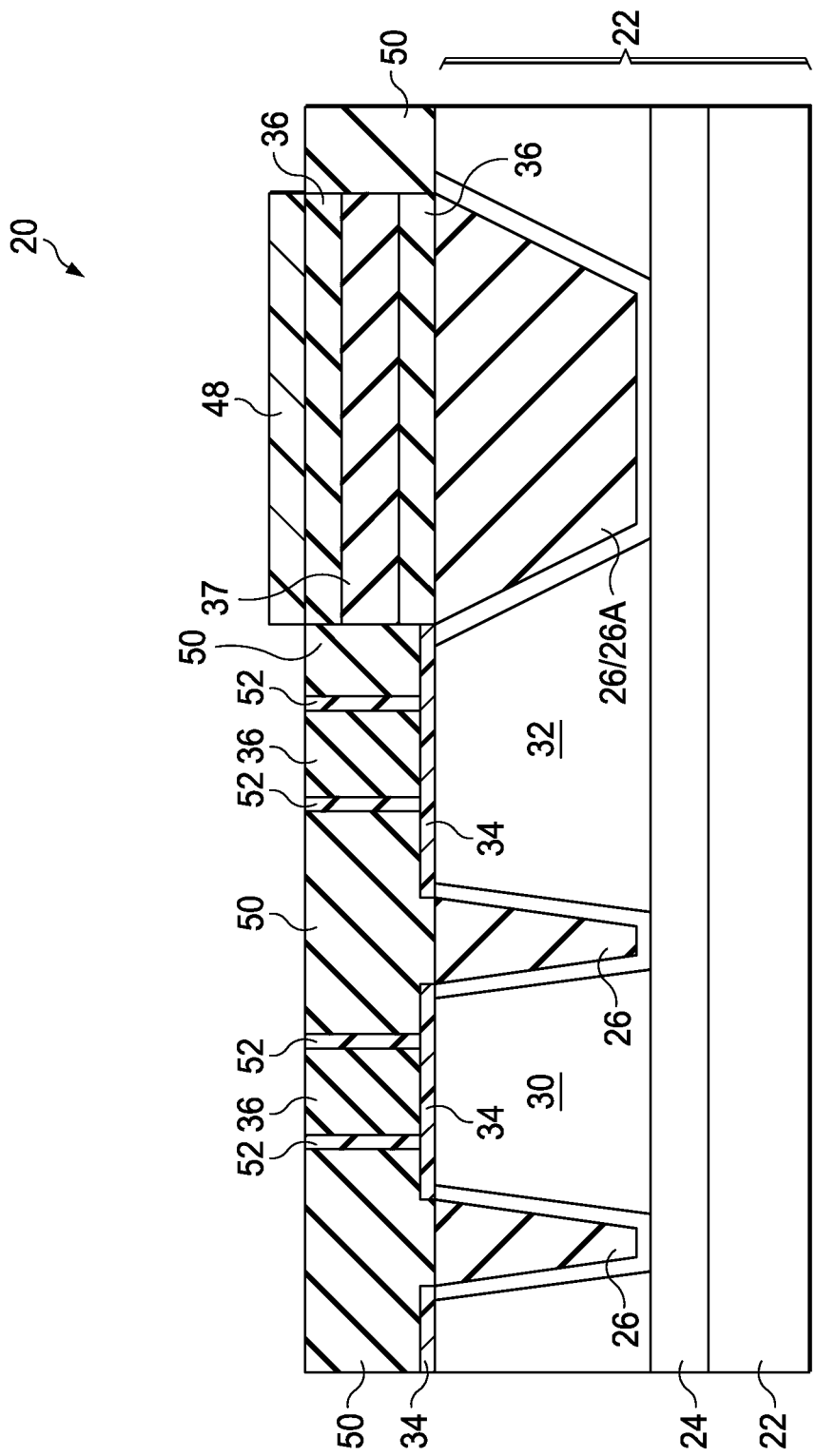

In FIG. 7, dielectric regions 50 are formed in openings 49. Dielectric regions 50 are alternatively referred to as inter-layer dielectric (ILD) 50 throughout the description. The material of ILD 50 may include an oxide such as phospho-silicate glass (PSG), boron-doped phospho-silicate glass (BPSG), borosilicate glass (BSG), tetraethyl orthosilicate (TEOS), or the like. The formation of ILD 50 may include a deposition step and a chemical mechanical polish (CMP) step. Optionally, liners 52, which may be formed of silicon carbonitride (SiCN), for example, may be formed before the deposition of the oxide. Accordingly, in the resulting structure, liners 52 are formed on the sidewalls of the remaining polysilicon regions 36.

Figure 8:
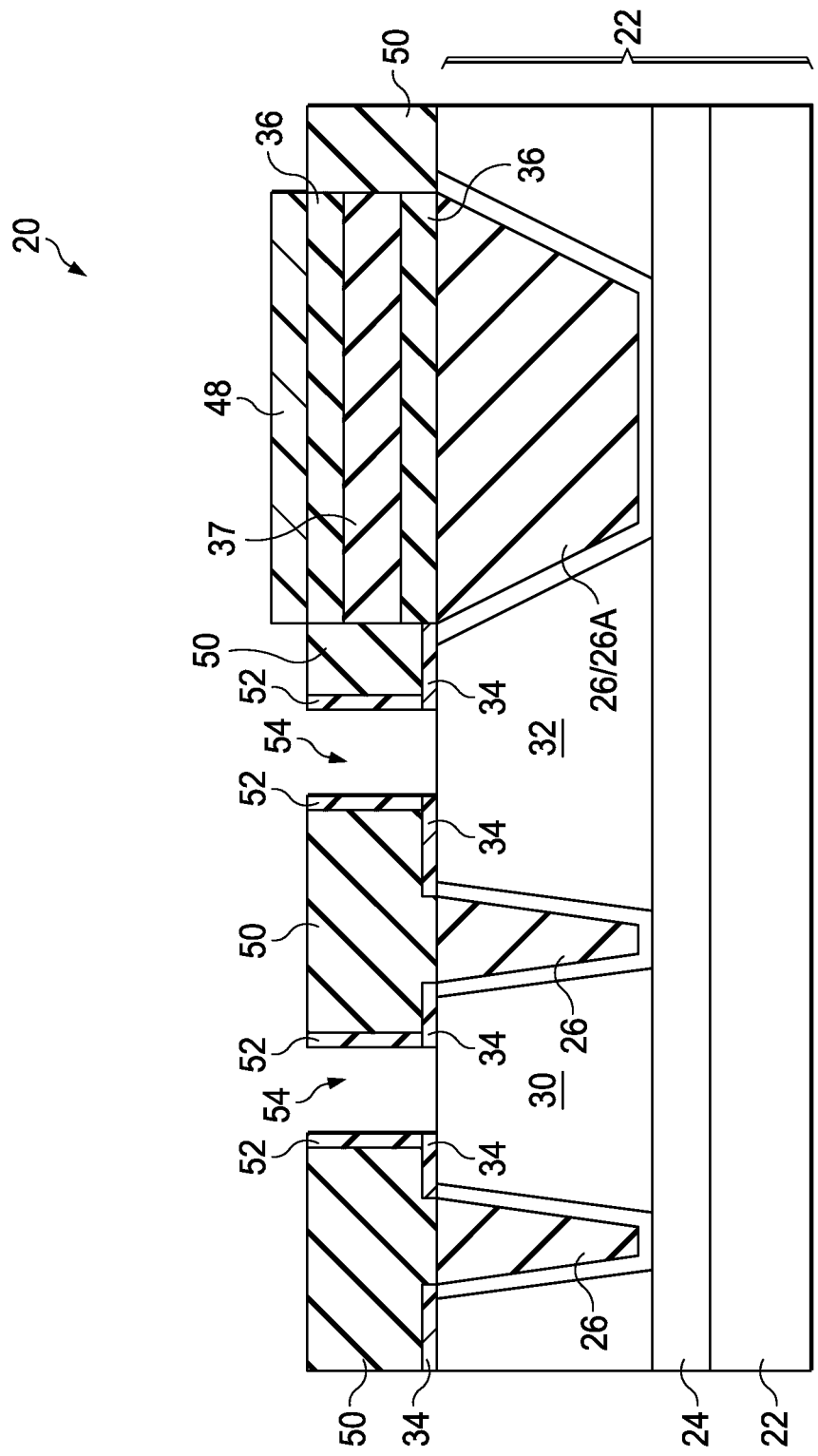
Figure 9:
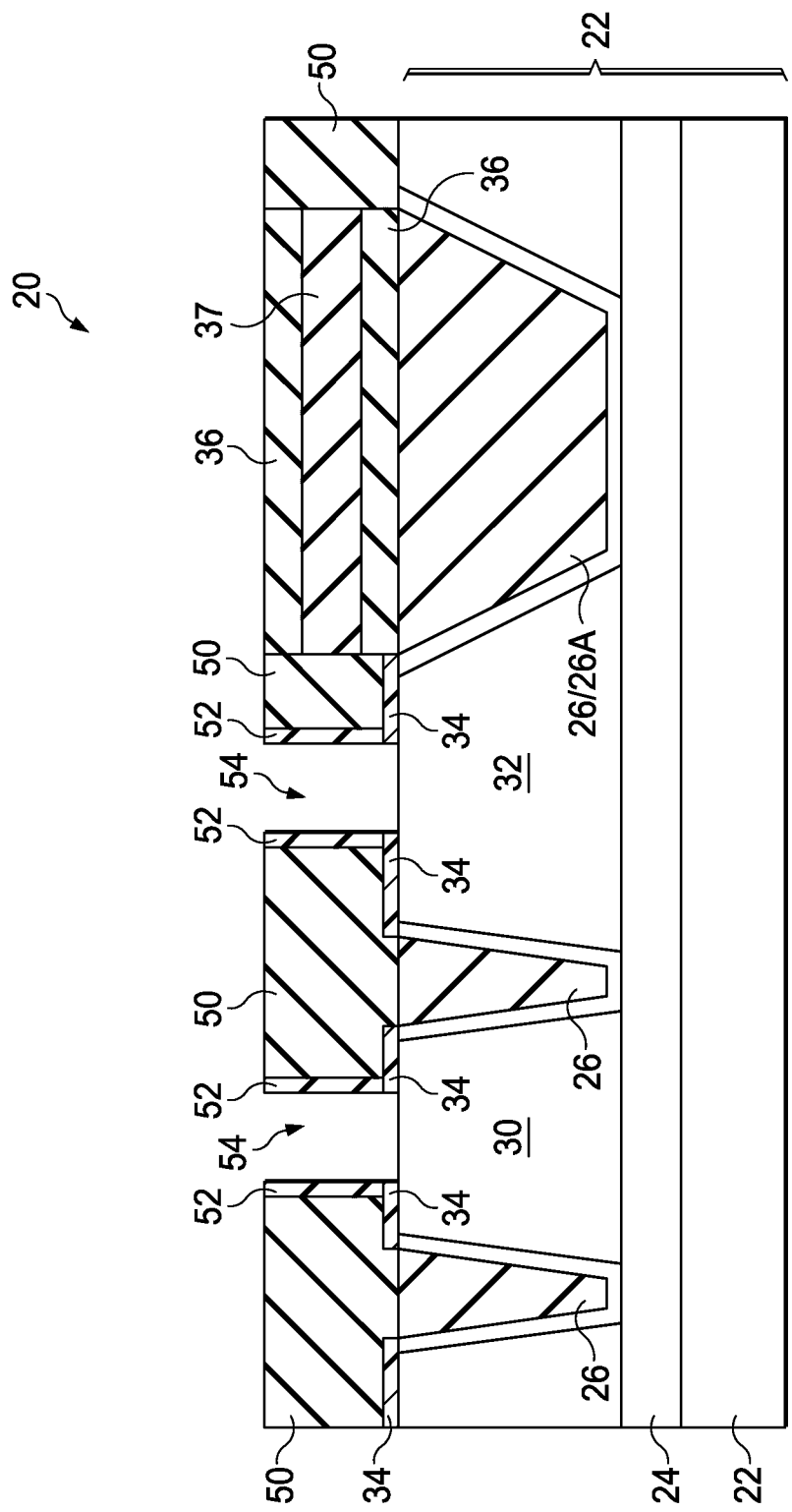
Figure 10:
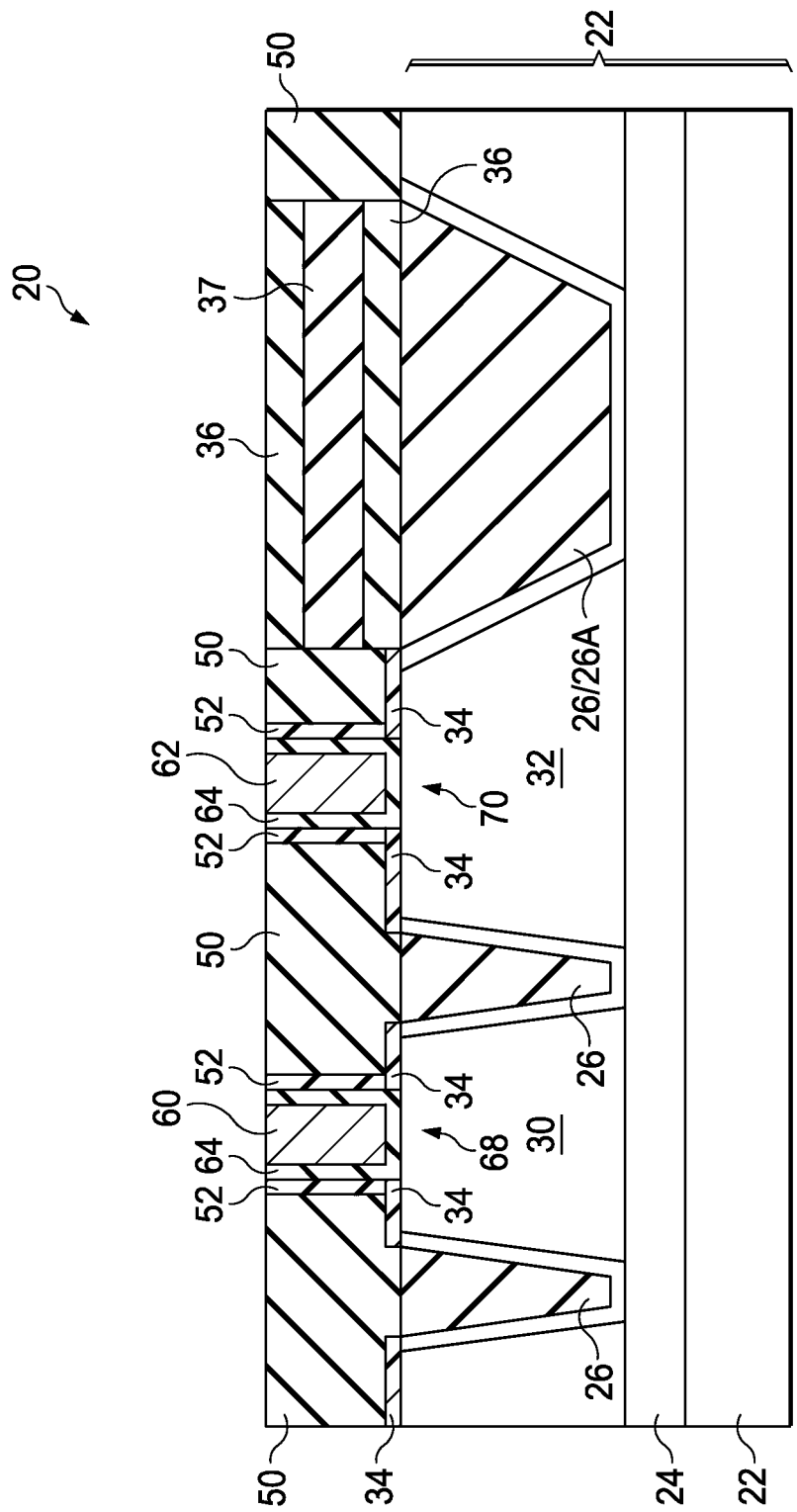

Referring to FIG. 8, exposed portions of polysilicon layer 36 are etched, forming openings 54 in ILD 50. Portions of oxide mask 34 that are exposed through openings 54 are then removed, and the underlying p-well region 30 and n-well region 32 are exposed. Liner 52 may or may not be etched during this process. The portion of polysilicon layer under the remaining portion of carbon-doped hard mask region 48 is protected from the etching. Next, referring to FIG. 9, carbon-doped hard mask region 48 is removed in an etching step. In FIG. 10, gate electrodes 60 and 62 and gate dielectrics 64 are formed in openings 54, wherein gate electrode 60 and the underlying gate dielectric 64 form a gate stack of n-type metal-oxide-semiconductor (NMOS) device (a transistor) 68, and gate electrode 62 and the underlying gate dielectric 64 form a gate stack of p-type metal-oxide-semiconductor (PMOS) device 70. The gate stacks of NMOS device 68 and PMOS device 70 may be formed separately, so that gate electrodes 60 and 62 may be formed of different metals having different work functions. Gate dielectrics 64 may have a k value greater than 3.9, greater than about 7.0, or greater than about 20. Furthermore, gate dielectrics 64 may be formed of a high-k dielectric material such as an Hf-containing oxide, a La-containing oxide, or the like. The formation of each of the gate stacks of NMOS device 68 and PMOS device 70 may include depositing a gate dielectric layer, depositing a gate electrode layer (which may be a metal layer), and then performing a CMP to remove portions of the gate dielectric layer and the gate electrode layer over ILD 50.

Figure 11:
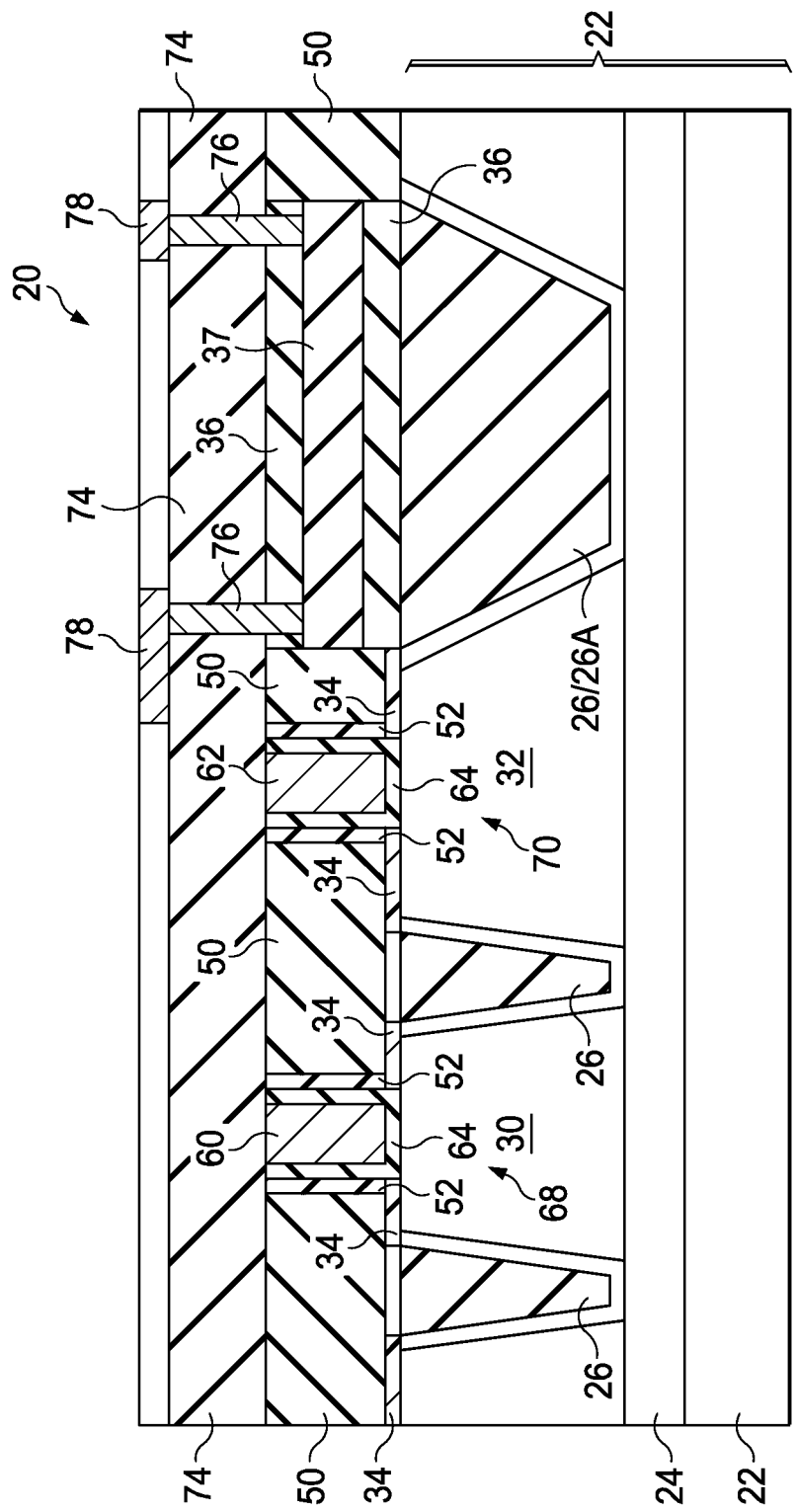

FIG. 11 illustrates the formation of ILD 74, contact plugs 76, and metal lines 78 that are connected to contact plugs 76. Contact plugs 76 are electrically coupled to the opposite ends of doped polysilicon region 37, so that doped polysilicon region 37 forms a polysilicon resistor.

In the embodiments shown in FIGS. 1 through 11, doped polysilicon region 37 and carbon-doped hard mask region 48 are formed using the same lithography mask 45 and the same photo resist 42 (FIG. 3). FIGS. 12 through 16 illustrate process steps in accordance with alternative embodiments, wherein doped polysilicon region 37 and carbon-doped hard mask region 48 are formed using a same lithography mask and different photo resists. The different photo resists, however, are patterned using the same lithography mask. Unless specified otherwise, the reference numerals in these embodiments represent like elements in the embodiments illustrated in FIGS. 1 through 11. The initial structure of these embodiments is essentially the same as shown in FIG. 1.

Figure 12:
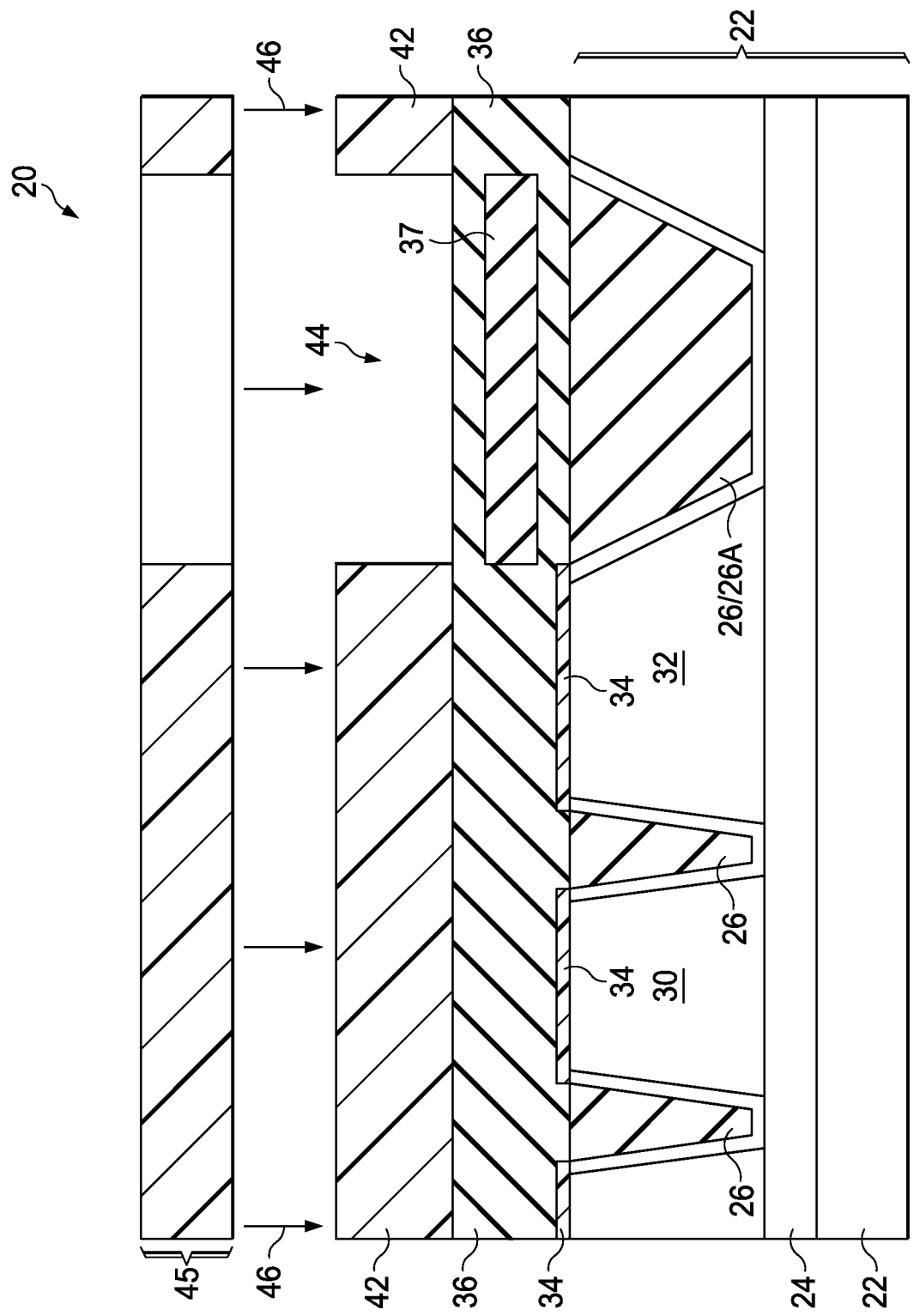
FIGS. 12 through 16 are cross-sectional views of intermediate stages in the manufacturing of a polysilicon resistor in accordance with various alternative embodiments.
Figure 13:
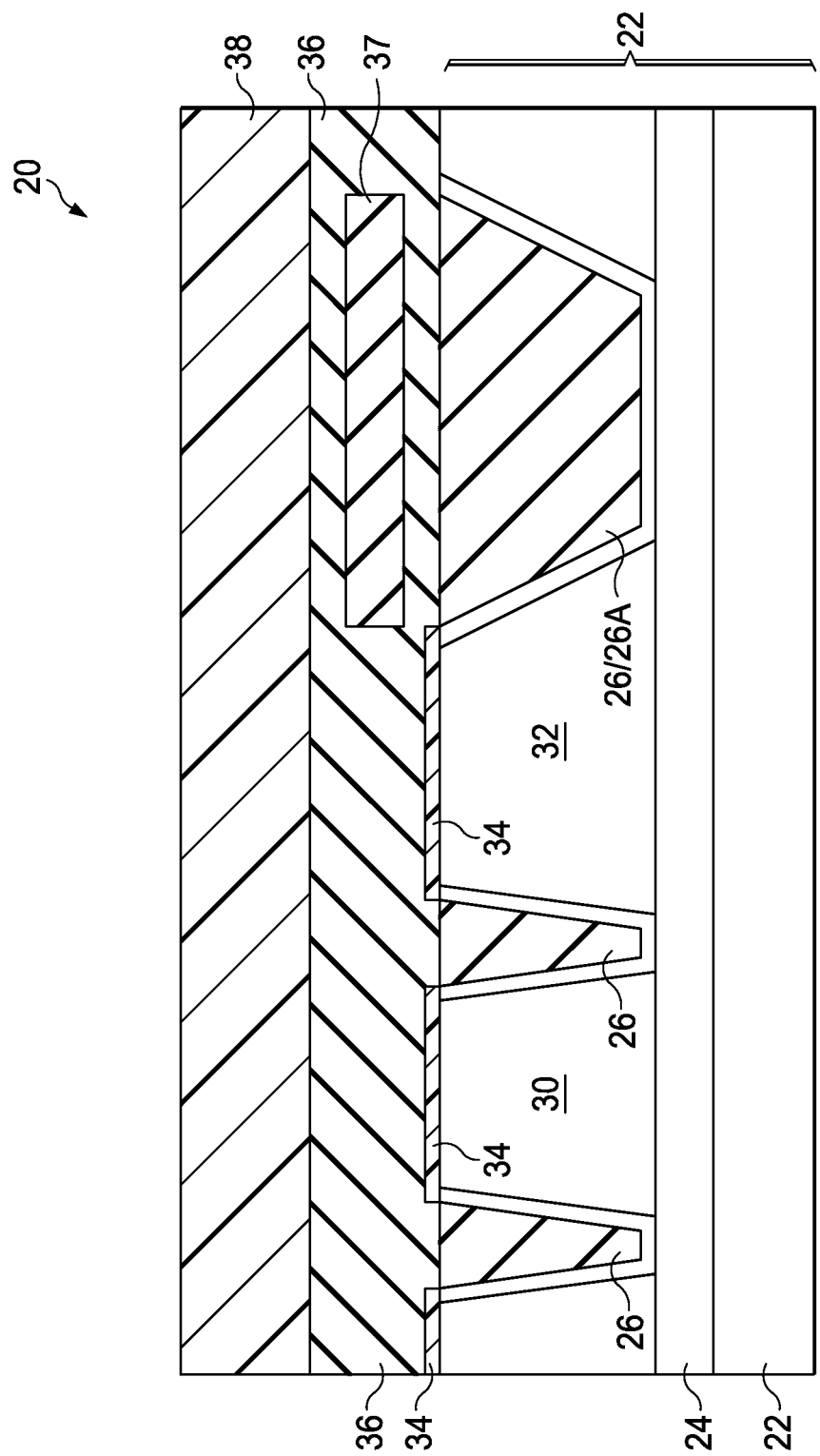
Figure 14:
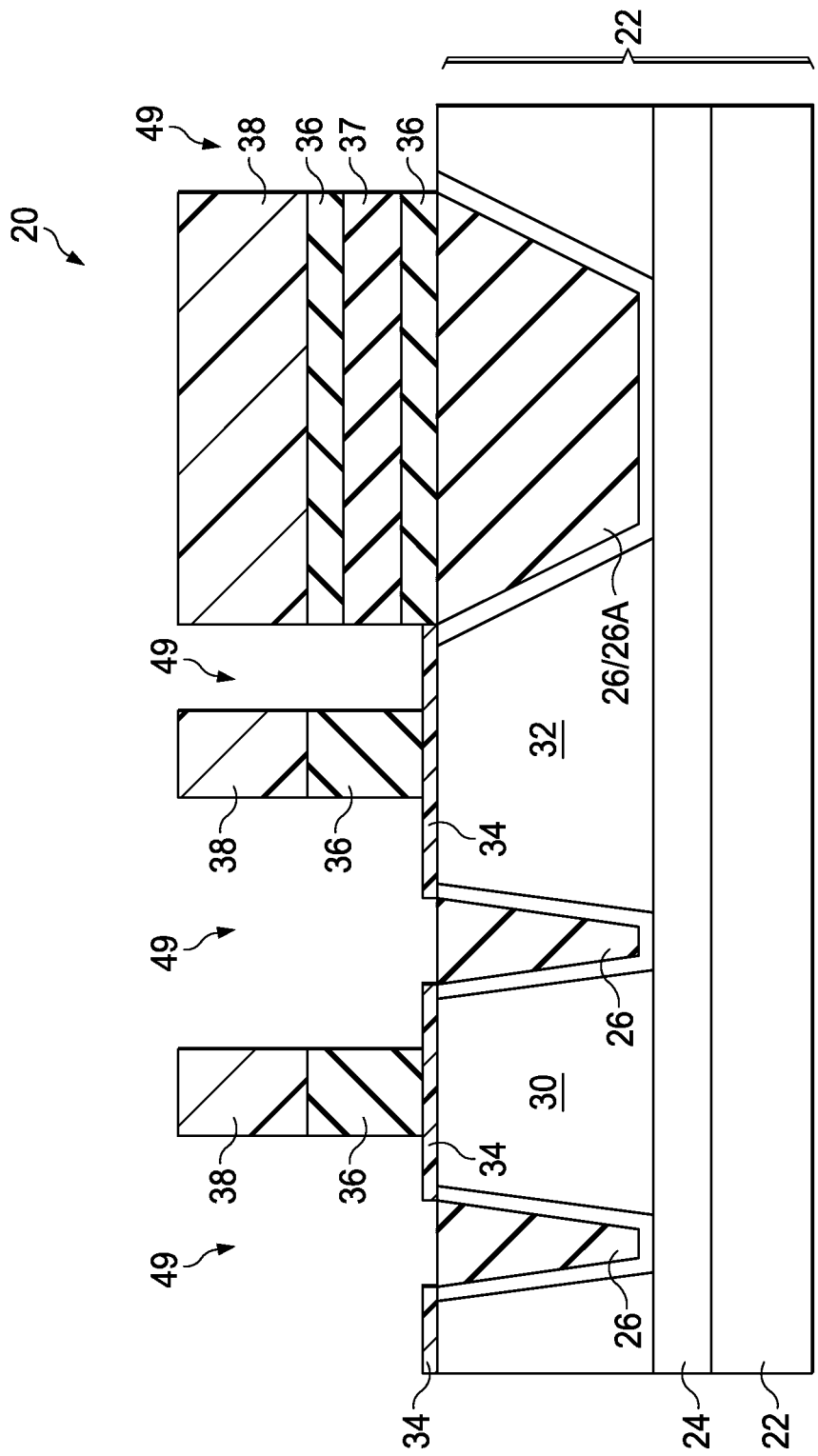

Next, after the structure as in FIG. 1 is formed, the steps shown in FIG. 12 are performed. As shown in FIG. 12, photo resist 42 is formed and patterned, and a portion of polysilicon layer 36 directly over STI region 26A is exposed through opening 44 in photo resist 42. The patterning of photo resist 42 may be performed using lithography mask 45, which comprises opaque portions for blocking the light for exposing photo resist 42, and transparent portions for allowing the light to pass. After lithography mask 45 is moved away from over wafer 20, an implantation (indicated by arrows 46) is performed to dope polysilicon layer 36, so that doped polysilicon region 37 is formed. Doped polysilicon region 37 may be doped with boron, although other p-type or n-type impurities may be implanted. Next, photo resist 42 is removed. In FIG. 13, hard mask layer 38 is formed over polysilicon layer 36. FIG. 14 illustrates the formation of openings 49, which is formed by etching into polysilicon layer 36.

Figure 15:
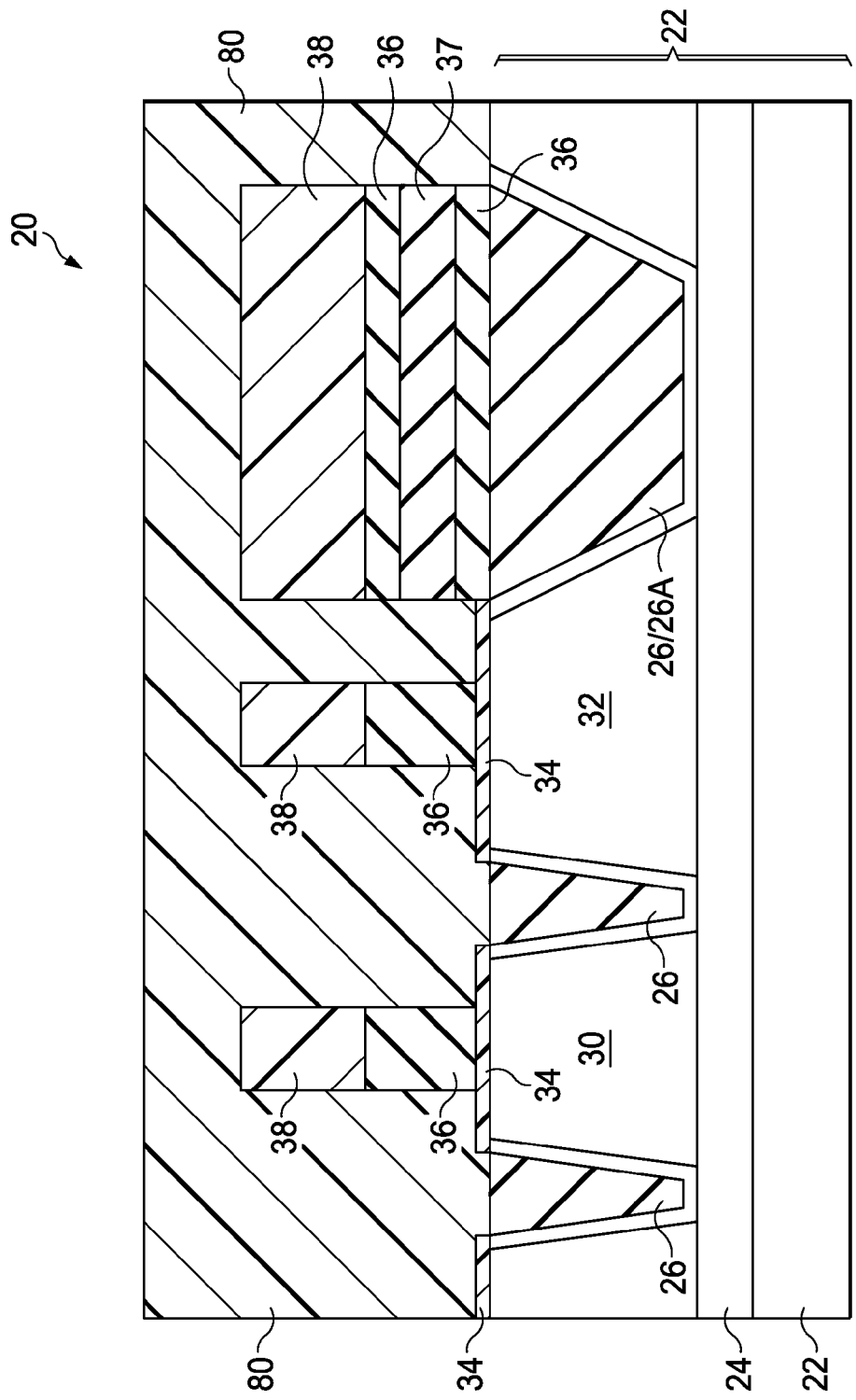
Figure 16:
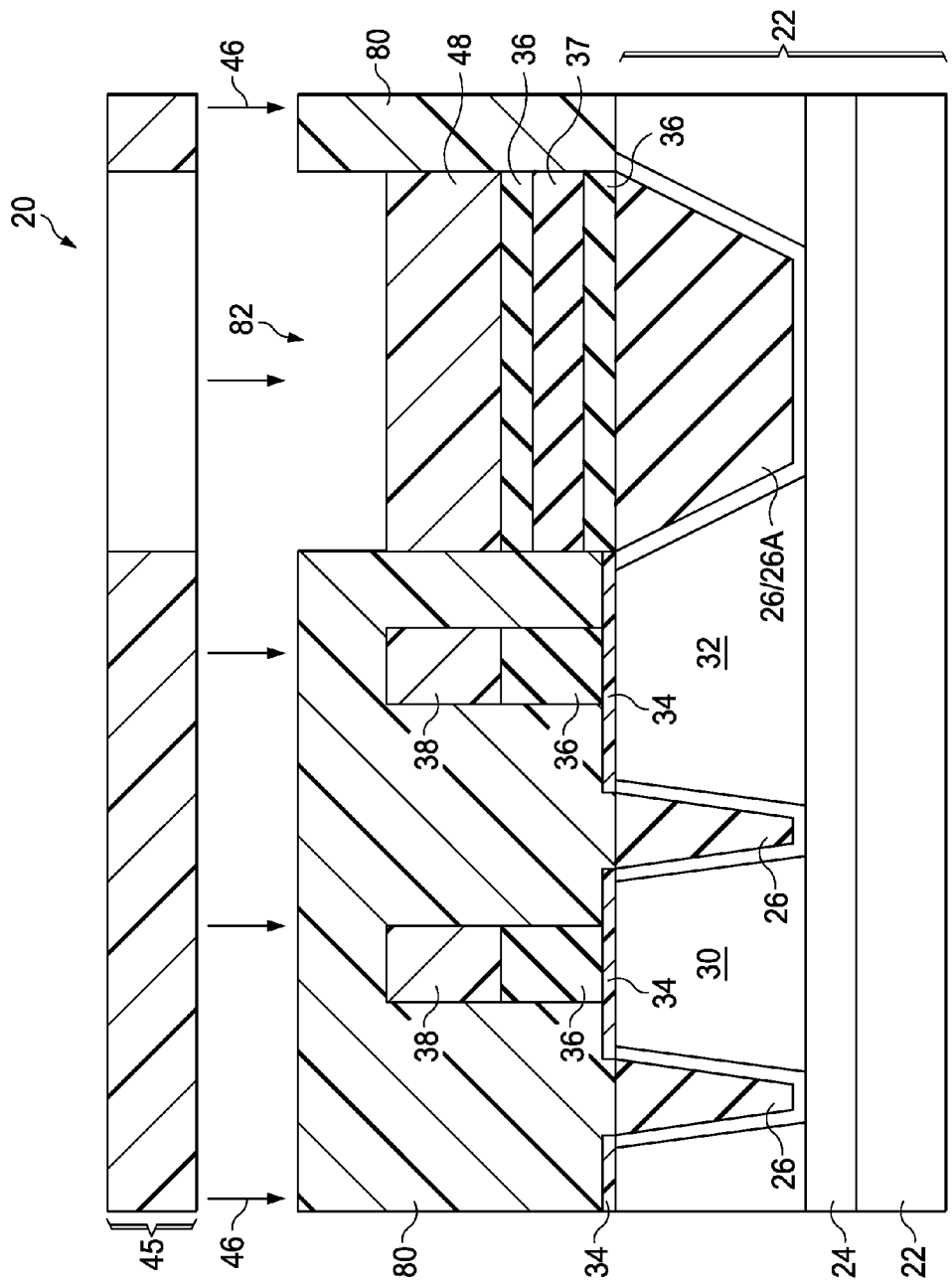

Next, as shown in FIG. 15, photo resist 80 is formed to cover the structure shown in FIG. 14. Photo resist 80 also covers hard mask layer 38. Next, as shown in FIG. 16, photo resist 80 is patterned. The patterning of photo resist 80 may be performed using the same lithography mask 45 that is used in the patterning of photo resist 42 (FIG. 12). A portion of photo resist 80 is thus removed to form opening 82 in photo resist 80. Opening 82 is substantially aligned to doped polysilicon region 37. An implantation my then be performed through opening 82 to form doped hard mask region 48. Carbon may be used as the dopant, and hence doped hard mask region 48 may also be referred to as carbon-doped hard mask region 48 hereinafter, although other dopants may be used. Photo resist 80 is then removed, and the resulting structure is essentially the same as shown in FIG. 5. The remaining process steps of these embodiments are essentially the same as shown in FIGS. 6 through 11. The process details and the related materials may be referred to according to the process shown in FIGS. 6 through 11, and hence are not repeated herein.

In the embodiments, doped hard mask region 48 have a lower etching rate than the undoped portions of hard mask layer 38. As a result, doped hard mask region 48 has at least a bottom portion remaining after an etching step, while undoped portions of hard mask layer 38 (please refer to FIGS. 5 and 6) are removed. Accordingly, in the removal of polysilicon layer 36 (FIGS. 7 and 8), doped hard mask region 48 acts as the mask to protect doped polysilicon region 37 from being removed. A mask that otherwise would be needed for forming an additional mask to protect doped polysilicon region 37 is thus saved. The manufacturing cost is accordingly lowered. In addition, the formation of the additional mask (if formed) for protecting doped polysilicon region 37 may involve forming and removing an oxide layer, which may cause ILD 50 (FIG. 7) to be undesirably etched. In the embodiments, since the additional mask is no longer needed, ILD 50 is also not undesirably etched. Accordingly, the embodiments also eliminate the side effects accompanying the formation of the additional mask.

In accordance with embodiments, a method includes forming a polysilicon layer over a substrate, forming a hard mask over the polysilicon layer, and doping a first portion of the hard mask with a dopant to form a doped hard mask region, wherein a second portion of the hard mask is not doped with the dopant. An etching step is performed to etch the first and the second portions of the hard mask, wherein the second portion of the hard mask is removed, and wherein at least a bottom portion of the doped hard mask region is not removed. After the etching step, the bottom portion of the doped hard mask region is removed. Electrical connections are formed to connect to a portion of the polysilicon layer in order to form a resistor.

In accordance with other embodiments, a method includes forming a polysilicon layer over a substrate, forming a hard mask layer over the polysilicon layer, and forming a photo resist over the hard mask layer and patterning the photo resist. The polysilicon layer is implanted with a first dopant to form a doped polysilicon region in the polysilicon layer. The hard mask layer is implanted with a second dopant to form a doped hard mask region in the hard mask layer, wherein the steps of implanting the polysilicon layer and the hard mask layer are performed using the same photo resist as an implantation mask. The method further includes etching the hard mask layer, wherein portions of the hard mask layer not doped with the second dopant are substantially fully removed after the step of etching, and wherein the doped hard mask region has at least a bottom portion not removed after the step of etching. A portion of the polysilicon layer not covered by the doped hard mask region is replaced with a gate stack of a transistor.

In accordance with yet other embodiments, a method includes forming a polysilicon layer over a substrate, forming a first photo resist over the polysilicon layer and patterning the first photo resist, and implanting the polysilicon layer with a first dopant to form a doped polysilicon region in the polysilicon layer, wherein the polysilicon layer is implanted using the first photo resist as a mask. The method further includes, after the step of implanting the polysilicon layer, forming a hard mask layer over the polysilicon layer, etching the hard mask layer and the polysilicon layer to form a first opening over a well region in the substrate, and forming a second photo resist into the first opening and over the hard mask layer. The second photo resist is patterned to form a second opening in the second photo resist, wherein the second opening is over and overlapping the doped polysilicon region. The hard mask layer is implanted with a second dopant to form a doped hard mask region in the hard mask layer, wherein the step of implanting the hard mask layer is performed using the second photo resist as an implantation mask. The hard mask layer is etched, wherein portions of the hard mask layer not doped with the second dopant are etched through, and wherein the doped hard mask region has at least a bottom portion not removed. A portion of the polysilicon layer is replaced with a gate stack of a transistor.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a polysilicon layer over a substrate;
   forming a hard mask over the polysilicon layer;
   doping a first portion of the hard mask with a dopant to form a doped hard mask region, wherein a second portion of the hard mask is not doped with the dopant;
   performing an etching step to etch the first and the second portions of the hard mask, wherein the second portion of the hard mask is removed, and wherein at least a bottom portion of the doped hard mask region is not removed;
   after the etching step, removing the bottom portion of the doped hard mask region; and
   forming electrical connections to connect to a portion of the polysilicon layer in order to form a resistor.

2. The method of claim 1 further comprising implanting the portion of the polysilicon layer to dope a p-type or an n-type impurity in order to form a doped polysilicon region, wherein the step of doping the first portion of the hard mask and the step of implanting the portion of the polysilicon layer are performed using a same patterned photo resist as an implantation mask.

3. The method of claim 1 further comprising implanting a portion of the polysilicon layer to dope a p-type or an n-type impurity in order to form a doped polysilicon region, wherein the step of doping the first portion of the hard mask and the step of implanting the portion of the polysilicon layer are performed using different patterned photo resists as masks, and wherein the different patterned photo resists are patterned using a same lithography mask.

4. The method of claim 1 further comprising removing portions of the polysilicon layer not covered by the first portion of the hard mask to form an opening.

5. The method of claim 4 further comprising, after the step of removing the first portion of the hard mask, filling a gate dielectric and a gate electrode into the opening to form a gate stack of a transistor.

6. The method of claim 1, wherein the step of doping the first portion of the hard mask with the dopant comprises implanting carbon into the first portion of the hard mask.

7. A method comprising:
   forming a polysilicon layer over a substrate;
   forming a hard mask layer over the polysilicon layer;
   forming a photo resist over the hard mask layer and patterning the photo resist;
   implanting the polysilicon layer with a first dopant to form a doped polysilicon region in the polysilicon layer;
   implanting the hard mask layer with a second dopant to form a doped hard mask region in the hard mask layer, wherein the steps of implanting the polysilicon layer and the hard mask layer are performed using the photo resist as an implantation mask;
   etching the hard mask layer, wherein portions of the hard mask layer not doped with the second dopant are substantially fully removed after the step of etching, and wherein the doped hard mask region has at least a bottom portion not removed after the step of etching; and
   replacing a portion of the polysilicon layer not covered by the doped hard mask region with a gate stack of a transistor.

8. The method of claim 7, wherein the step of implanting the hard mask layer with the second dopant comprises implanting carbon into the hard mask layer.

9. The method of claim 7, wherein in the step of etching the hard mask layer, both the portions of the hard mask layer not doped with the second dopant and the doped hard mask region are exposed and subject to the etching.

10. The method of claim 7 further comprising:
after the step of replacing the portion of the polysilicon layer with the gate stack, removing the doped hard mask region; and
forming electrical connections to connect to the doped polysilicon region to form a resistor.

11. The method of claim 7 further comprising:
before the step of etching the hard mask layer, forming openings in the hard mask layer and the polysilicon layer, wherein the openings extend into the portions of the hard mask layer not doped with the second dopant;
filling the openings with a dielectric material to form an inter-layer dielectric; and
forming electrical connections through the inter-layer dielectric to connect to the doped polysilicon region, wherein the doped polysilicon region forms a resistor.

12. The method of claim 7, wherein the step of implanting the polysilicon layer with the first dopant comprising implanting boron into the polysilicon layer.

13. The method of claim 7, wherein the doped polysilicon region and the doped hard mask region are formed over and overlapping a shallow-trench isolation (STI) region.

14. A method comprising:
forming a polysilicon layer over a substrate;
forming a first photo resist over the polysilicon layer and patterning the first photo resist;
implanting the polysilicon layer with a first dopant to form a doped polysilicon region in the polysilicon layer, wherein the polysilicon layer is implanted using the first photo resist as a mask;
after the step of implanting the polysilicon layer, forming a hard mask layer over the polysilicon layer;
etching the hard mask layer and the polysilicon layer to form a first opening over a well region in the substrate;
forming a second photo resist into the first opening and over the hard mask layer;
patterning the second photo resist to form a second opening in the second photo resist, wherein the second opening is over and overlapping the doped polysilicon region;
implanting the hard mask layer with a second dopant to form a doped hard mask region in the hard mask layer, wherein the step of implanting the hard mask layer is performed using the second photo resist as an implantation mask;
etching the hard mask layer, wherein portions of the hard mask layer not doped with the second dopant are etched through, and wherein the doped hard mask region has at least a bottom portion not removed; and
replacing a portion of the polysilicon layer with a gate stack of a transistor.

15. The method of claim 14, wherein the step of patterning the first photo resist and the step of patterning the second photo resist are performed using a same lithography mask.

16. The method of claim 14, wherein the step of implanting the hard mask layer with the second dopant comprises implanting carbon into the hard mask layer.

17. The method of claim 14, wherein in the step of etching the hard mask layer, both the portions of the hard mask layer not doped with the second dopant and the doped hard mask region are exposed and subject to the etching.

18. The method of claim 14 further comprising:
after the step of replacing, removing the doped hard mask region; and
forming electrical connections to connect to the doped polysilicon region, wherein the doped polysilicon region forms a resistor.

19. The method of claim 14 further comprising:
before the step of etching the hard mask layer, forming openings in the hard mask layer and the polysilicon layer, wherein the openings extend into the portions of the hard mask layer not doped with the second dopant;
filling the openings with a dielectric material to form an inter-layer dielectric; and
forming electrical connections penetrating through the inter-layer dielectric, wherein the doped polysilicon region are connected to the electrical connections to form a resistor.

20. The method of claim 14, wherein the doped polysilicon region and the doped hard mask region are formed over and overlapping a shallow-trench isolation (STI) region.

* * * * *